(12) United States Patent
Kreiter et al.

(10) Patent No.: US 11,621,204 B2
(45) Date of Patent: Apr. 4, 2023

(54) MOLDED SEMICONDUCTOR MODULE HAVING A MOLD STEP FOR INCREASING CREEPAGE DISTANCE

(71) Applicant: Infineon Technologies AG, Neubiberg (DE)

(72) Inventors: Oliver Markus Kreiter, Warstein (DE); Ludwig Busch, Erwitte (DE); Angel Enverga, Melaka (MY); Mei Fen Hiew, Melaka (MY); Tian See Hoe, Melaka (MY); Elvis Keli, Bad Sassendorf (DE); Kean Ming Koe, Penang (MY); Sanjay Kumar Murugan, Melaka (MY); Michael Niendorf, Verl (DE); Ivan Nikitin, Regensburg (DE); Bernhard Stiller, Rott am Inn (DE); Thomas Stoek, Buxtehude (DE); Ke Yan Tean, Melaka (MY)

(73) Assignee: Infineon Technologies AG, Neubiberg (DE)

(*) Notice: Subject to any disclaimer, the term of this patent is extended or adjusted under 35 U.S.C. 154(b) by 156 days.

(21) Appl. No.: 17/177,703

(22) Filed: Feb. 17, 2021

(65) Prior Publication Data
US 2022/0262693 A1 Aug. 18, 2022

(51) Int. Cl.
*H01L 23/495* (2006.01)
*H01L 23/31* (2006.01)
(Continued)

(52) U.S. Cl.
CPC ...... *H01L 23/3114* (2013.01); *H01L 21/4825* (2013.01); *H01L 21/565* (2013.01); *H01L 23/49548* (2013.01); *H01L 23/49568* (2013.01)

(58) Field of Classification Search
CPC ......... H01L 23/49568; H01L 23/49548; H01L 21/565
(Continued)

(56) References Cited

U.S. PATENT DOCUMENTS 5,672,910 A * 9/1997 Majumdar ........ H01L 23/49555
257/730
7,728,413 B2 * 6/2010 Iwade ................. H01L 23/3107
438/122

(Continued)

OTHER PUBLICATIONS

"Automotive 750 V, 800 A Dual Side Cooling Half-Bridge Power Module", VE-Trac™ Dual NVG800A75L4DSC, ON Semiconductor,, Dec. 2019—Rev. 1, pp. 1-13.

*Primary Examiner* — Nitin Parekh
(74) *Attorney, Agent, or Firm* — Murphy, Bilak & Homiller, PLLC

(57) ABSTRACT

A semiconductor module includes: a dual-gauge leadframe having thicker and thinner parts, part of the thinner part forming a high voltage lead; a semiconductor die attached to the thicker part; and a molding compound (MC) encapsulating the die. The thicker leadframe part is disposed at a bottom side of the MC. A side face of the MC has a stepped region between the high voltage lead and thicker leadframe part. A first generally vertical part of the stepped region extends from the high voltage lead to the generally horizontal part, a generally horizontal part of the stepped region extends to the second generally vertical part, and a second generally vertical part of the stepped region extends to the bottom side of the MC. A linear dimension of the generally horizontal part as measured from the first generally vertical part to the second generally vertical part is at least 4.5 mm.

22 Claims, 5 Drawing Sheets

(51) Int. Cl.
*H01L 21/56* (2006.01)
*H01L 21/48* (2006.01)

(58) Field of Classification Search
USPC .......................................... 257/675, 666, 787
See application file for complete search history.

(56) References Cited

U.S. PATENT DOCUMENTS

| | | |
|---|---|---|
| 7,847,395 B2 | 12/2010 | Baek et al. |
| 8,648,456 B1 | 2/2014 | Mahler et al. |
| 10,811,345 B2 * | 10/2020 | Muto ................... H01L 23/3107 |
| 11,127,663 B2 * | 9/2021 | Choi ................... H01L 23/4334 |
| 2005/0145999 A1 * | 7/2005 | Mamitsu ............. H01L 23/4334 |
| | | 257/667 |
| 2007/0052072 A1 * | 3/2007 | Iwade ..................... H01L 24/33 |
| | | 257/E23.092 |
| 2021/0005528 A1 * | 1/2021 | Kamimura .......... H01L 23/3675 |

* cited by examiner

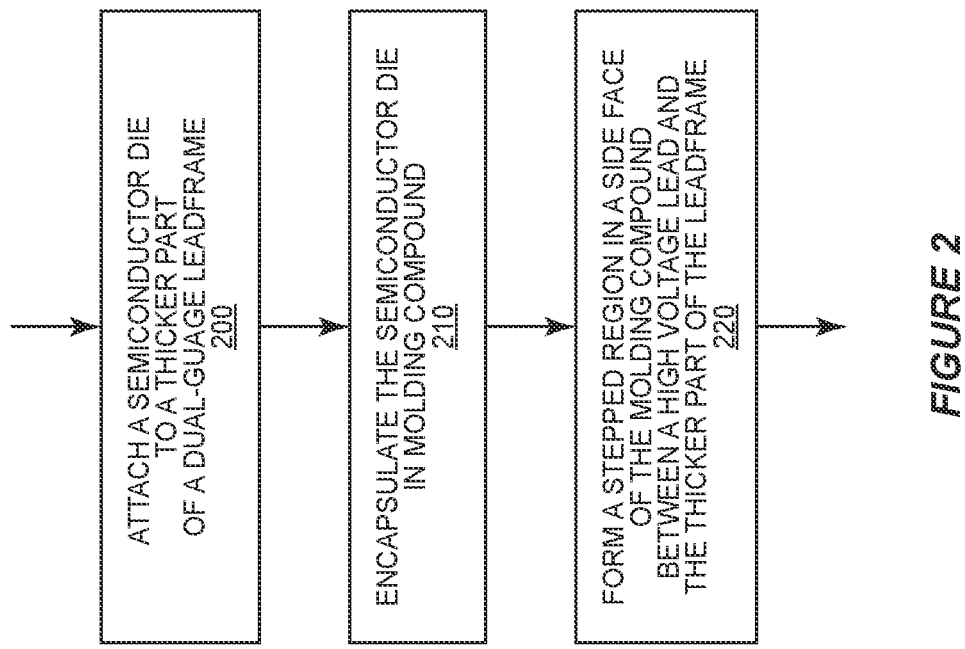

MOLDED SEMICONDUCTOR MODULE HAVING A MOLD STEP FOR INCREASING CREEPAGE DISTANCE

BACKGROUND

Both creepage and clearance are key considerations when mounting molded semiconductor modules. Creepage is the shortest distance between two conducting points along the surface of an insulating material, whereas clearance is the shortest distance in the air between two conducting parts. When a flat molded semiconductor module is pressed onto a cooler, only thermal interface material (TIM) separates the cooler and the module. The thickness of the TIM is usually about 100 µm, meaning the gap between the module and cooler is less than 1 mm. In accordance with International Standard IEC 60664-1 issued by the Commission Electrotechnique Internationale and UL Standard 840 for safety insulation coordination including clearances and creepage distances for electrical equipment, gaps below 1 mm must be handled as non-existent when determining the creepage distance, e.g., for pollution degrees used in a main inverter where pollution degrees is a classification according to the amount of dry pollution and condensation present in the environment and which affects creepage and clearance distances required to ensure the safety of the main inverter. Accordingly, the creepage distance from the module pins to the cooler is given by the distance from the pins to the cooler along the module side. More specifically, the path along the module bottom from the module edge to the exposed metal of the module at the backside does not count in the creepage distance calculation, which is consequently reduced significantly. For a module with 90° mold angles, this means the creepage distance equals the clearance distance.

The cooler may be specially designed with a plateau in the region of attachment to a molded semiconductor module. Another option is to use a cooler having a smaller footprint that the molded semiconductor module. Both options increase the cost and complexity of the cooler design. Also, the tolerances and material properties (e.g., stiffness, minimum wall thickness, etc.) involved suggest both options are suboptimal.

Thus, there is a need for an improved molded semiconductor module design with increased creepage distance.

SUMMARY

According to an embodiment of a molded semiconductor module, the molded semiconductor module comprises: a dual-gauge leadframe having a thicker part and a thinner part, part of the thinner part forming a high voltage lead of the molded semiconductor module; a semiconductor die attached to the thicker part of the dual-gauge leadframe; and a molding compound encapsulating the semiconductor die and having a top side, a bottom side, and a side face extending between the top side and the bottom side, wherein the thicker part of the leadframe is disposed at the bottom side of the molding compound, wherein the side face of the molding compound has a stepped region between the high voltage lead and the thicker part of the leadframe, wherein the stepped region has a first generally vertical part, a second generally vertical part, and a generally horizontal part, wherein the first generally vertical part extends from the high voltage lead to the generally horizontal part, the generally horizontal part extends from the first generally vertical part to the second generally vertical part, and the second generally vertical part extends from the generally horizontal part to the bottom side of the molding compound, wherein a linear dimension of the generally horizontal part as measured from the first generally vertical part to the second generally vertical part is at least 4.5 mm.

According to an embodiment of a method of producing a molded semiconductor module, the method comprises: attaching a semiconductor die attached to a thicker part of a dual-gauge leadframe, the dual-gauge leadframe further having a thinner part, part of the thinner part forming a high voltage lead of the molded semiconductor module; encapsulating the semiconductor die in a molding compound having a top side, a bottom side, and a side face extending between the top side and the bottom side, the thicker part of the leadframe being disposed at the bottom side of the molding compound; and forming a stepped region in the side face of the molding compound between the high voltage lead and the thicker part of the leadframe, wherein the stepped region has a first generally vertical part, a second generally vertical part, and a generally horizontal part, wherein the first generally vertical part extends from the high voltage lead to the generally horizontal part, the generally horizontal part extends from the first generally vertical part to the second generally vertical part, and the second generally vertical part extends from the generally horizontal part to the bottom side of the molding compound, wherein a linear dimension of the generally horizontal part as measured from the first generally vertical part to the second generally vertical part is at least 4.5 mm.

According to an embodiment of a power electronic assembly, the power electronic assembly comprises: a molded semiconductor module attached to a cooling device, wherein the molded semiconductor module comprises: a dual-gauge leadframe having a thicker part and a thinner part, part of the thinner part forming a high voltage lead of the molded semiconductor module; a semiconductor die attached to the thicker part of the dual-gauge leadframe; and a molding compound encapsulating the semiconductor die and having a top side, a bottom side, and a side face extending between the top side and the bottom side, wherein the thicker part of the leadframe is thermally coupled to the cooling device at the bottom side of the molding compound, wherein the side face of the molding compound has a stepped region between the high voltage lead and the thicker part of the leadframe, wherein the stepped region has a first generally vertical part, a second generally vertical part, and a generally horizontal part, wherein the first generally vertical part extends from the high voltage lead to the generally horizontal part, the generally horizontal part extends from the first generally vertical part to the second generally vertical part, and the second generally vertical part extends from the generally horizontal part to the bottom side of the molding compound, wherein a linear dimension of the generally horizontal part as measured from the first generally vertical part to the second generally vertical part is at least 4.5 mm.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2 illustrates an embodiment of a method of producing the molded semiconductor module.

DETAILED DESCRIPTION

The embodiments described herein provide a step in the molding compound of a molded semiconductor module for increasing the creepage distance between the leads of the module and a cooling device to which the module is to be attached. The stepped region of the molding compound allows for the introduction of an isolation material in the gap between the stepped region of the molded semiconductor module and the cooling device. The stepped region of the molding compound may be introduced close to the die pad at the backside of the module, e.g., less than 2 mm, less than 1.6 mm or even about 1mm from the die pad. By forming the stepped region in the molding compound and introducing the additional isolation material, the creepage path is led along the module body and/or along the isolation material surface without violating the sub 1 mm distance requirement specified in IEC 60664-1 and UL Standard 840.

The stepped region of the molding compound may be applied in various sizes, e.g., as determined by the target voltage class of the module and/or thickness of the isolation material. In general, the stepped region of the molding compound is preferably positioned as near as possible to the die pad at the backside of the module while still ensuring adequate molding compound coverage in this region of the module. In some cases, the stepped region of the molding compound may have a height greater than 1 mm. In these cases, the additional isolation material may be omitted.

Described next, with reference to the figures, are exemplary embodiments of the molded semiconductor module and related method of production and power electronic assembly.

Figure 1A:
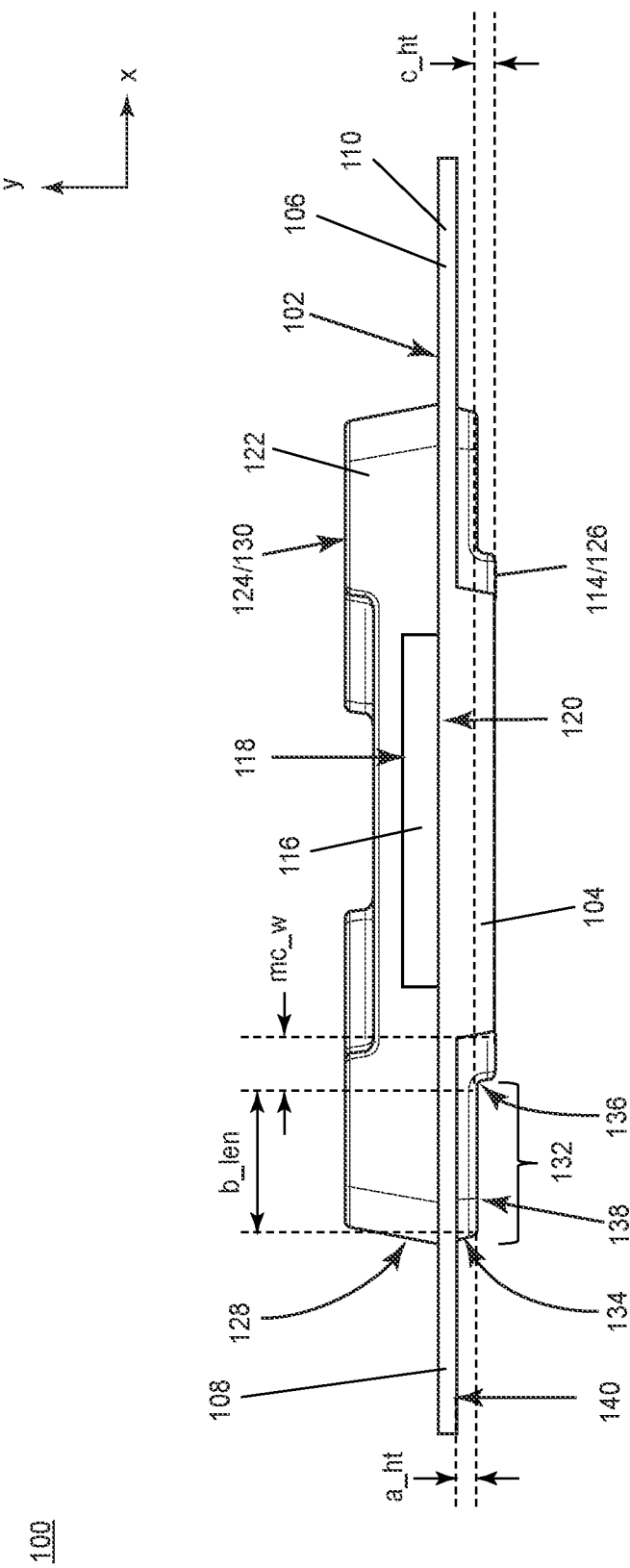
FIG. 1A illustrates a cross-sectional view of a molded semiconductor module.
Figure 1B:
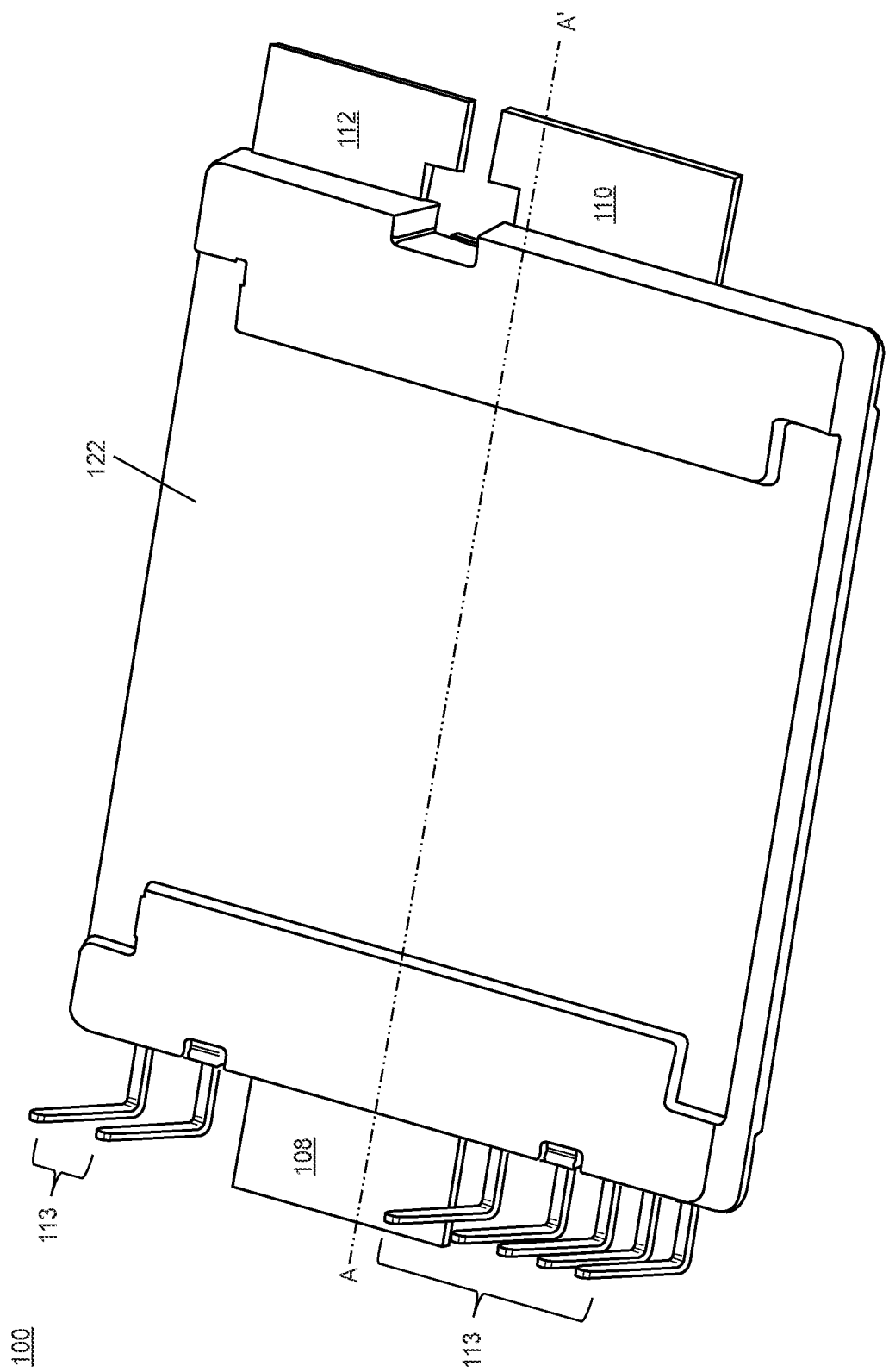
FIG. 1B illustrates a bottom perspective view of the molded semiconductor module.

FIG. 1A illustrates a cross-sectional view of a molded semiconductor module 100. FIG. 1B illustrates a bottom perspective view of the molded semiconductor module 100. The cross-section shown in FIG. 1A is taken along the line labelled A-A' in FIG. 1B.

The molded semiconductor module 100 includes a dual-gauge leadframe 102 having a thicker part 104 and a thinner part 106. Part of the thinner part 106 of the dual-gauge leadframe 102 forms a high voltage lead 108 of the molded semiconductor module 100. Other parts of the thinner part 106 of the dual-gauge leadframe 102 may form other leads 110, 112, 113 such as a ground lead, gate lead, signal leads, etc. The thicker part 104 of the dual-gauge leadframe 102 forms a die pad at a backside 114 of the molded semiconductor module 100 to which a cooling device (not shown in FIGS. 1A and 1B) is to be attached.

At least one semiconductor die (chip) 114 is attached to the thicker part 116 of the dual-gauge leadframe 102, e.g. by solder. Heat generated by the semiconductor die 114 during operation is dissipated to the cooling device through the thicker part 104 of the dual-gauge leadframe 102. Electrical connections which are not shown in FIG. 1A are provided between the leads 108, 110, 110 and the semiconductor die 116, e.g., by wire bonds, ribbon bonds, one or more metal clips, etc. The dual-gauge leadframe 102 may be formed from a single piece of metal or metal alloy such as Cu, Al, AlCu, etc. and patterned by stamping, etching, etc. to isolate the leads 108, 110, 110 from the thicker part 104 of the dual-gauge leadframe 102 which forms a die pad for receiving the semiconductor die 116.

The semiconductor die 116 may comprise any type of semiconductor material such as but not limited to Si, SiC, GaN, etc. The semiconductor die 116 may include a lateral or vertical power device. In the case of a lateral power device, all power and signal connections to the semiconductor die 116 are made at the front side 118 of the die 116. For example, in the case of a lateral GaN power HEMT (high-electron-mobility transistor), source, drain and gate connections may be made at the front side 118 of the die 116. In the case of a vertical power device, some power and possibly even signal connections to the semiconductor die 116 are made at the back side 120 of the die 116. For example, in the case of a vertical power MOSFET or vertical IGBT, source/emitter and gate connections may be made at the front side 118 of the die 116 and the drain/collector connection may be made at the back side 120 of the die 116.

The semiconductor die 116 may include other types of power devices such as but not limited to a MOS gated diode, power diode, etc. Driver circuitry for the power device may also be included in the semiconductor die 116 as may related control circuitry. Alternatively, the control and/or driver circuitry may be located in another semiconductor die attached to the dual-gauge leadframe 102 or included in a separate module (not shown). As used herein, the term "power device" intends to describe a semiconductor device with high voltage blocking and/or high current-carrying capabilities. In other words, the semiconductor die 116 may be configured for high current, typically in the Ampere range, e.g., up to several Amperes or up to several tens or hundreds of Amperes, and/or high voltages, typically 40 V and above, e.g., up to at least 50V, up to at least 100V, up to at least 400 V or even more, e.g., up to at least 3 kV, or even up to 10 kV or more.

A molding compound 122 encapsulates the semiconductor die 116. The molding compound 122 may include a wide variety of electrically insulating encapsulant materials including ceramics, epoxy materials and thermosetting plastics, to name a few. While the molded semiconductor module 100 is shown as a single-sided cooled module in FIGS. 1A and 1B, the molded semiconductor module 100 may instead be a double-sided cooled module by providing metal structures uncovered by the molding compound 122 at both main sides 114, 124 of the module 100.

The molding compound 122 has a top side 124, a bottom side 126, and a side face 128 extending between the top side 124 and the bottom side 126. The top side 124 of the molding compound 122 defines the front side 130 of the molded semiconductor module 100 and the bottom side 126 of the molding compound 122 defines the backside 114 of the molded semiconductor module 100. The thicker part 104 of the dual-gauge leadframe 102 is disposed at the bottom side 126 of the molding compound 122 and may be structured to increase adhesion between the molding compound 122 and the leadframe 102.

The side face 128 of the molding compound 122 has a stepped region 132 between the high voltage lead 108 and the thicker part 104 of the dual-gauge leadframe 102. The stepped region 132 of the molding compound 122 has a first generally vertical part 134, a second generally vertical part 136, and a generally horizontal part 138. The term "generally vertical" as used herein means mostly vertical along direction 'y' in FIG. 1A but not necessarily parallel to direction y. The first generally vertical part 134 and second generally vertical part 136 of the stepped region 132 may include linear and/or curved surfaces. The term "generally horizontal" as used herein means mostly horizontal along direction 'x' in FIG. 1A but not necessarily parallel to direction x. The generally horizontal part 134 of the stepped region 132 may include linear and/or curved surfaces.

The first generally vertical part 134 of the stepped region 132 of the molding compound 122 extends from the high voltage lead 108 to the generally horizontal part 138 of the stepped region 132. The generally horizontal part 138 of the stepped region 132 extends from the first generally vertical part 134 to the second generally vertical part 136 of the stepped region 132. The second generally vertical part 136 of the stepped region 132 extends from the generally horizontal part 138 to the bottom side 126 of the molding compound 122. A linear dimension 'b_len' of the generally horizontal part 138 of the stepped region 132 as measured from the first generally vertical part 134 to the second generally vertical part 136 is at least 4.5 mm.

In one embodiment, a linear dimension 'a_ht' of the first generally vertical part 134 of the stepped region 132 of the molding compound 122 as measured from the high voltage lead 108 to the generally horizontal part 138 of the stepped region 132 is less than 1 mm.

Separately or in combination, a linear dimension 'c_ht' of the second generally vertical part 136 of the stepped region 132 of the molding compound 122 as measured from the generally horizontal part 138 of the stepped region 132 to the bottom side 126 of the molding compound 122 is less than 1 mm. Accordingly, linear dimension a_ht of the first generally vertical part 134 of the stepped region 132 may be less than 1 mm and linear dimension c_ht of the second generally vertical part 136 of the stepped region 132 may be greater than 1 mm, or a_ht may be greater than 1 mm and c_ht may be less than 1 mm, or both a_ht and c_ht may be less than 1 mm. In one embodiment, linear dimension a_ht of the first generally vertical part 134 of the stepped region 132 is 0.7 mm and linear dimension c_ht of the second generally vertical part 136 of the stepped region 132 also is 0.7 mm.

Separately or in combination, a linear dimension 'mc_w' of the molding compound 122 as measured from the second generally vertical part 136 of the stepped region 132 to the thicker part 104 of the dual-gauge leadframe 104 is less than 2 mm, e.g., less than 1.6 mm or even 1 mm depending on the tolerances involved with forming the molding compound 122. That is, the lateral or horizontal thickness of the molding compound 122 between the recessed edge 136 of the stepped region 132 and the thicker part 104 of the dual-gauge leadframe 102 may be greater than zero and less than 2 mm.

Separately or in combination, a ratio (b_len/mc_w) of the linear dimension b_len of the generally horizontal part 138 of the stepped region 132 of the molding compound 122 to the linear dimension mc_w of the molding compound 122 as measured from the second generally vertical part 136 of the stepped region 132 to the thicker part 104 of the dual-gauge leadframe 102 is at least 4:1. For b_len=5.66 mm and mc_w=0.7 mm, this means the ratio of b_len/mc_w may be at least 8:1.

Separately or in combination, the thickness (a_ht+c_ht) of the molded semiconductor package 100 as measured from the bottom side 140 of the high voltage lead 108 to the bottom side 126 of the molding compound 122 is less than 1.5 mm, e.g., 1 mm or less. In such low clearance cases, a dimension b_len of at least 4.5 mm for the generally horizontal part 138 of the stepped region 132 ensures the horizontal length of the stepped region 132 is included in the creepage distance calculation. Moreover, a length b_len of at least 4.5 mm for the generally horizontal part 138 of the stepped region 132 satisfies the minimum creepage distance requirement for a target impulse withstand voltage of 4.2 kV at 1 second in accordance with IEC Standard 60664.

FIG. 2 illustrates an embodiment of a method of producing the molded semiconductor module 100. The method includes attaching the at least one semiconductor die 116 to the thicker part 104 of the dual-gauge leadframe 102 (Block 200). Any standard die attach material may be used such as solder, an adhesive, etc.

The method further includes encapsulating the semiconductor die 114 in the molding compound 122 such that the thicker part 104 of the dual-gauge leadframe 102 is disposed at the bottom side 126 of the molding compound 122 (Block 210). For example, the molding compound 122 may be formed by placing the assembly in a three-dimensional chamber and injecting liquified encapsulant material into the chamber. Examples of such techniques include injection molding, transfer molding, and compression molding. In another embodiment, the molding compound 122 may be formed by a lamination technique.

The method further includes forming the stepped region 132 in the side face 128 of the molding compound 122 between the high voltage lead 108 and the thicker part 104 of the dual-gauge leadframe 102 (Block 220). The stepped region 132 may be formed during the encapsulation process or formed afterword, e.g., by laser etching, chemical etching, etc. In either case, the stepped region 132 is formed in the molding compound 122 such that the linear dimension b_len of the generally horizontal part 138 of the stepped region 132 as measured from the first generally vertical part 134 to the second generally vertical part 136 of the stepped region 132 is at least 4.5 mm.

Figure 3:
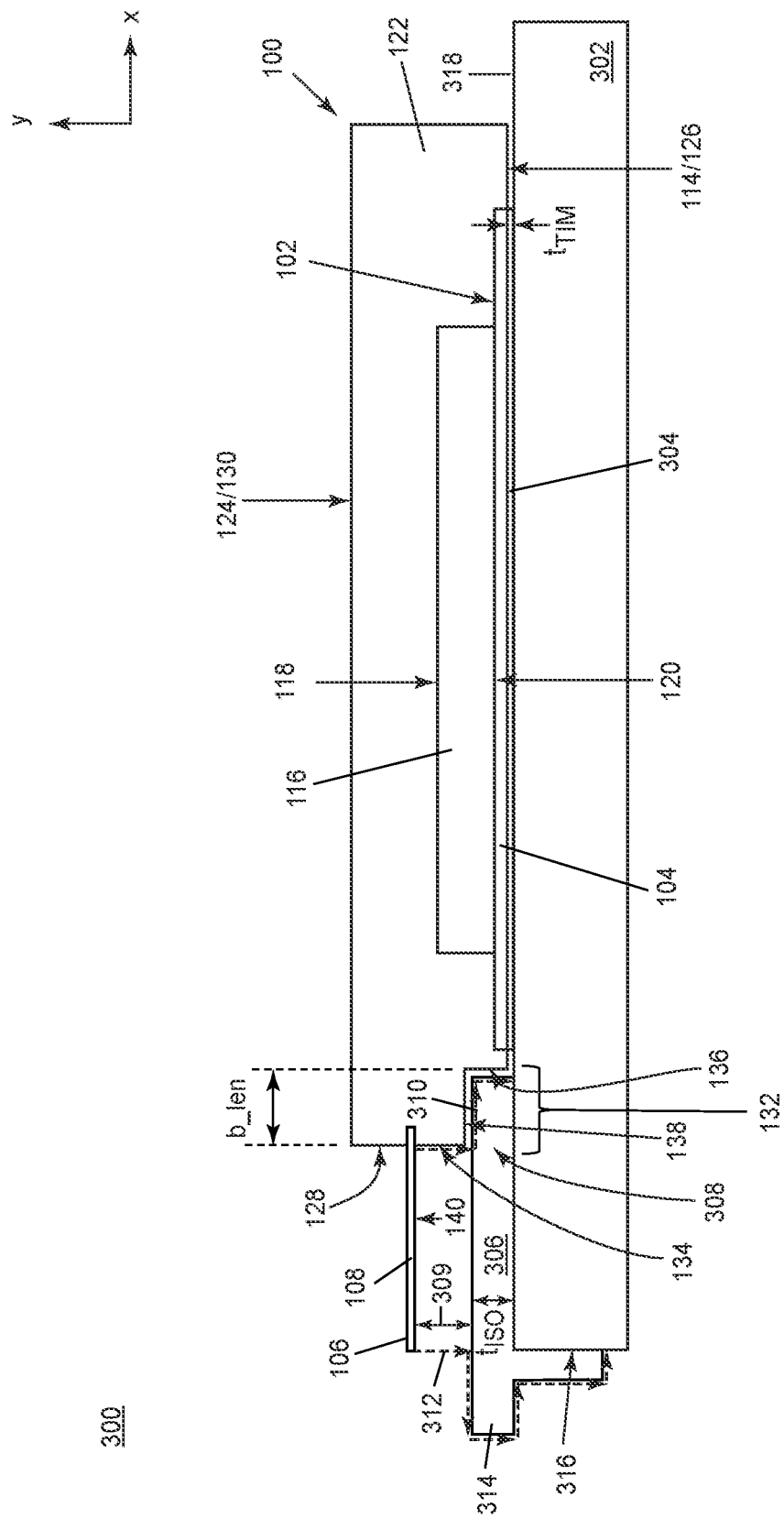
FIG. 3 illustrates a cross-sectional view of a power electronic assembly that includes the molded semiconductor module attached to a cooling device.

FIG. 3 illustrates a cross-sectional view of a power electronic assembly 300 that includes the molded semiconductor module 100 attached to a cooling device 302. The cooling device 302 comprises metal or a metal alloy such as Cu, Al, AlCu, etc. and may be air cooled or liquid cooled. In one embodiment, the power electronic assembly 300 is an inverter assembly and the molded semiconductor module 100 may be one of several such modules electrically coupled within the power electronic assembly 300 to form a multi-phase bridge rectifier for motor drive or other applications. In general, the semiconductor module 100 is constructed as previously described herein. The thicker part 104 of the dual-gauge leadframe 102 is thermally coupled to the cooling device 302 at the bottom side 126 of the molding compound 122. In one embodiment, a thermal interface material (TIM) 304 is provided between the cooling device 302 and the bottom side 126 of the molding compound 122 of the molded semiconductor module 100.

For example, the TIM 304 may be a thermal grease. In another example, the TIM 304 may be an isolation material that is applied via a compression molding process and which covers the exposed pad area of the thicker part 104 of the dual-gauge leadframe 102 to isolate the module interior from the outside. In the case of an isolation material applied via compression molding, the TIM 304 may be a silicon-based material or an epoxy-based material. In the case of an epoxy-based isolation material which is relatively hard compared to silicon-based isolation materials, an additional thermal interface material (not shown) such as thermal grease may be provided between the molded semiconductor module 100 and the cooling device 302.

An isolation material 306 may be disposed in the gap 308 between the stepped region 132 of the molded semiconductor module 100 and the cooling device 302. The isolation material 306 may occupy all or just a portion of the gap 308. The isolation material 306 provides isolation from the potential of the high voltage lead 108 of the molded semiconductor module 100 to ground, e.g., isolation of 400V to 800V or more. The isolation material 306 may be thicker than the TIM 304. For example, the TIM 304 may have a thickness '$t_{TIM}$' in a range of 50 to 100 μm and the isolation material 306 may have a thickness '$t_{ISO}$' in a range of 200 to 700 μm. If the molded semiconductor module 100 is delivered without the TIM 304, the receiving party may apply an isolation foil (not shown) to the exposed pad area of the thicker part 104 of the dual-gauge leadframe 102 to isolate the module interior from the outside.

The isolation material 306 may be applied on the cooling device 302 itself or directly to the molded semiconductor module 100. Since the isolation material 306 is largely independent of the molded semiconductor module 100, the isolation material 306 may be adapted to the requirements of the power electronic assembly 300, e.g., by placement, dimensions, composition, etc. For example, the isolation material 306 may be a ceramic-based isolation material or an organic-based isolation material.

In the case of a ceramic-based isolation material, the isolation material 306 may be applied as a ceramic plate, ceramic coating, etc. to the attachment surface 318 of the cooling device 302. For example, this may include CVD (chemical vapour deposition) coating, PVD (physical vapour deposition) coating or an electrochemical oxidation process of an aluminum-based heatsink may be used. The ceramic-based isolation material may include, e.g., $Al_2O_3$, AlN, $Si_2O_3$ and combinations of such layers.

In the case of an organic-based isolation material, the isolation material 306 may comprise epoxy, imide, acrylate, cellulose, etc. The organic-based isolation material may be an organic insulation matrix containing inorganic particles, flex, phasers, mats, etc. for better mechanical and thermal properties. The particles may also be from metal insulated by oxides or nitrides, e.g., Al with $Al_2O_3$ coating.

Regardless of whether the isolation material 306 is provided or not, the linear dimension b_len of the generally horizontal part 138 of the stepped region 122 of the molding compound 122 as measured from the first generally vertical part 134 to the second generally vertical part 136 of the stepped region 132 is at least 4.5 mm as previously explained herein. Such a configuration allows for a small clearance 309 of less than 1.5 mm, e.g., 1 mm or even less between the high voltage lead 108 of the molded semiconductor module 100 and the isolation material 306 (if present) or the cooling device 302. The configuration also allows for a creepage path 310 that is led along the stepped region 132 of the molded module body and which is greater than 1 mm in total length. If the isolation material 306 is provided, the configuration further allows for a second creepage path 312 that is led along the surface of the isolation material 306.

The isolation material 306 may have surface features 314 such as protrusions, ridges, etc. which increase the creepage path 312 led along the surface of the isolation material 306. The isolation material 306 may extend onto the side (edge) face 316 of the cooling device 302.

The cooling device 302 may have a larger footprint than the molded semiconductor module 100 where the footprint of each corresponds to the area of the respective attachment surfaces 126, 318 of the cooling device 302 and molded semiconductor module 100. The isolation material 306, if provided, may cover the attachment surface 318 of the cooling device 302 facing the molded semiconductor module 100 in a region of the attachment surface 318 extending from the stepped region 132 of the molded semiconductor module 100 to the side face 316 of the cooling device 302.

Figure 4:
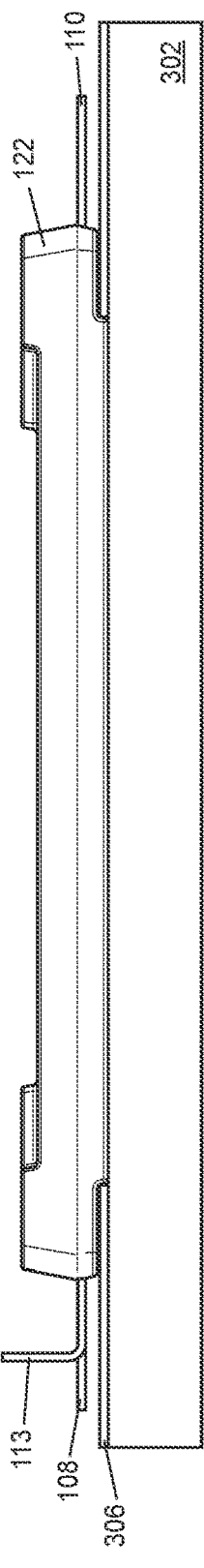
FIGS. 4 through 6 illustrate respective side perspective views of additional embodiments of power electronic assemblies that include the molded semiconductor module attached to the cooling device.

FIG. 4 illustrates a side perspective view of another embodiment of a power electronic assembly 400 that includes the molded semiconductor module 100 attached to the cooling device 302. The embodiment illustrated in FIG. 4 is similar to the embodiment illustrated in FIG. 3. Different, however, the isolation material 306 does not extend onto the side face 316 of the cooling device 302.

Figure 5:
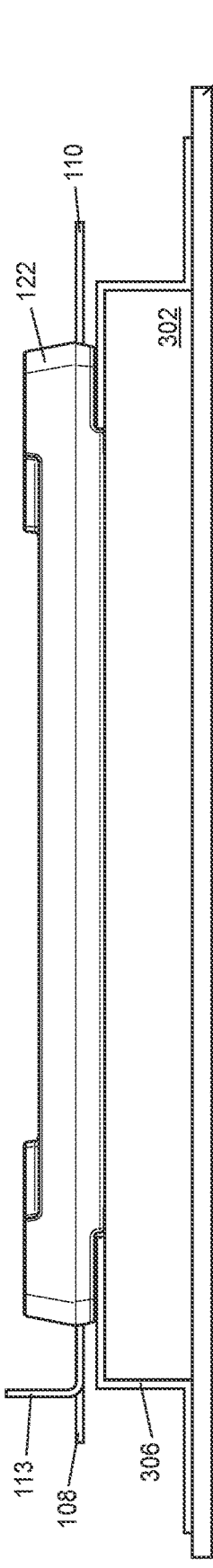

FIG. 5 illustrates a side perspective view of another embodiment of a power electronic assembly 500 that includes the molded semiconductor module 100 attached to the cooling device 302. The embodiment illustrated in FIG. 5 is similar to the embodiment illustrated in FIG. 3. Different, however, the isolation material 306 extends along the side face 316 of the cooling device 302 and onto a body 502 to which the cooling device 302 is mounted or forms a part of. For example, the power electronic assembly 500 may be an electronic automotive inverter assembly and the body 502 to which the cooling device 302 is mounted or forms a part of may be a housing of the electronic automotive inverter.

Figure 6:
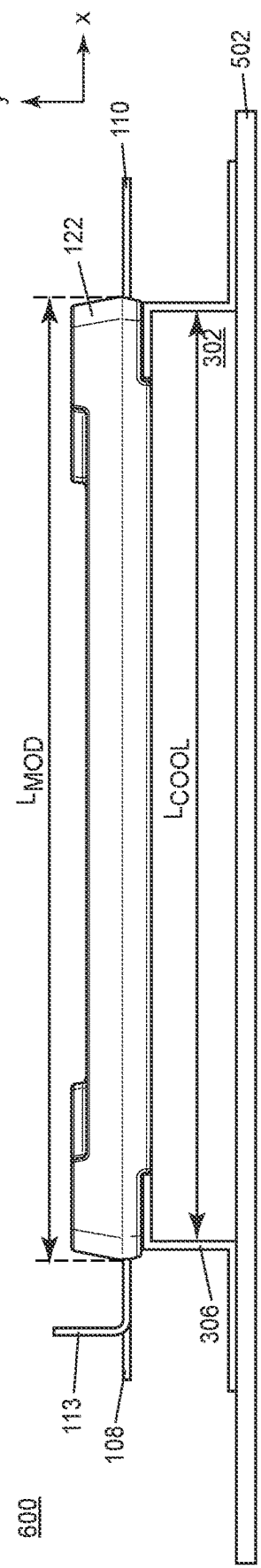

FIG. 6 illustrates a side perspective view of another embodiment of a power electronic assembly 600 that includes the molded semiconductor module 100 attached to the cooling device 302. The embodiment illustrated in FIG. 6 is similar to the embodiment illustrated in FIG. 5. Different, however, the linear dimension $L_{COOL}$ of the cooling device 302 in direction 'x' is smaller than the linear dimension $L_{MOD}$ of the molded semiconductor module 100 in the same direction.

Although the present disclosure is not so limited, the following numbered examples demonstrate one or more aspects of the disclosure.

Example 1. A molded semiconductor module, comprising: a dual-gauge leadframe having a thicker part and a thinner part, part of the thinner part forming a high voltage lead of the molded semiconductor module; a semiconductor die attached to the thicker part of the dual-gauge leadframe; and a molding compound encapsulating the semiconductor die and having a top side, a bottom side, and a side face extending between the top side and the bottom side, wherein the thicker part of the leadframe is disposed at the bottom side of the molding compound, wherein the side face of the molding compound has a stepped region between the high voltage lead and the thicker part of the leadframe, wherein the stepped region has a first generally vertical part, a second generally vertical part, and a generally horizontal part, wherein the first generally vertical part extends from the high voltage lead to the generally horizontal part, the generally horizontal part extends from the first generally vertical part to the second generally vertical part, and the second generally vertical part extends from the generally horizontal part to the bottom side of the molding compound, wherein a linear dimension of the generally horizontal part as measured from the first generally vertical part to the second generally vertical part is at least 4.5 mm.

Example 2. The molded semiconductor module of example 1, wherein a linear dimension of the first generally vertical part of the stepped region as measured from the high voltage lead to the generally horizontal part of the stepped region is less than 1 mm.

Example 3. The molded semiconductor module of example 1 or 2, wherein a linear dimension of the second generally vertical part of the stepped region as measured from the generally horizontal part of the stepped region to the bottom side of the molding compound is less than 1 mm.

Example 4. The molded semiconductor module of any of examples 1 through 3, wherein a linear dimension of the first generally vertical part of the stepped region as measured from the high voltage lead to the generally horizontal part of the stepped region is less than 1 mm, and wherein a linear dimension of the second generally vertical part of the stepped region as measured from the generally horizontal part of the stepped region to the bottom side of the molding compound is less than 1 mm.

Example 5. The molded semiconductor module of example 4, wherein the linear dimension of the first generally vertical part of the stepped region is 0.7 mm, and wherein the linear dimension of the second generally vertical part of the stepped region is 0.7 mm.

Example 6. The molded semiconductor module of any of examples 1 through 5, wherein a linear dimension of the molding compound as measured from the second generally vertical part of the stepped region to the thicker part of the leadframe is less than 2 mm.

Example 7. The molded semiconductor module of any of examples 1 through 6, wherein a ratio of the linear dimension of the generally horizontal part to a linear dimension of the molding compound as measured from the second generally vertical part of the stepped region to the thicker part of the leadframe is at least 4:1.

Example 8. The molded semiconductor module of example 7, wherein the ratio is at least 8:1.

Example 9. The molded semiconductor module of any of examples 1 through 8, wherein a thickness of the molded semiconductor package as measured from a bottom of the high voltage lead to the bottom side of the molding compound is less than 1.5 mm.

Example 10. A method of producing a molded semiconductor module, the method comprising: attaching a semiconductor die attached to a thicker part of a dual-gauge leadframe, the dual-gauge leadframe further having a thinner part, part of the thinner part forming a high voltage lead of the molded semiconductor module; encapsulating the semiconductor die in a molding compound having a top side, a bottom side, and a side face extending between the top side and the bottom side, the thicker part of the leadframe being disposed at the bottom side of the molding compound; and forming a stepped region in the side face of the molding compound between the high voltage lead and the thicker part of the leadframe, wherein the stepped region has a first generally vertical part, a second generally vertical part, and a generally horizontal part, wherein the first generally vertical part extends from the high voltage lead to the generally horizontal part, the generally horizontal part extends from the first generally vertical part to the second generally vertical part, and the second generally vertical part extends from the generally horizontal part to the bottom side of the molding compound, wherein a linear dimension of the generally horizontal part as measured from the first generally vertical part to the second generally vertical part is at least 4.5 mm.

Example 11. A power electronic assembly, comprising: a molded semiconductor module attached to a cooling device, wherein the molded semiconductor module comprises: a dual-gauge leadframe having a thicker part and a thinner part, part of the thinner part forming a high voltage lead of the molded semiconductor module; a semiconductor die attached to the thicker part of the dual-gauge leadframe; and a molding compound encapsulating the semiconductor die and having a top side, a bottom side, and a side face extending between the top side and the bottom side, wherein the thicker part of the leadframe is thermally coupled to the cooling device at the bottom side of the molding compound, wherein the side face of the molding compound has a stepped region between the high voltage lead and the thicker part of the leadframe, wherein the stepped region has a first generally vertical part, a second generally vertical part, and a generally horizontal part, wherein the first generally vertical part extends from the high voltage lead to the generally horizontal part, the generally horizontal part extends from the first generally vertical part to the second generally vertical part, and the second generally vertical part extends from the generally horizontal part to the bottom side of the molding compound, wherein a linear dimension of the generally horizontal part as measured from the first generally vertical part to the second generally vertical part is at least 4.5 mm.

Example 12. The power electronic assembly of example 11, further comprising an isolation material disposed in a gap between the stepped region of the molded semiconductor module and the cooling device.

Example 13. The power electronic assembly of example 12, wherein the isolation material extends onto a side face of the cooling device.

Example 14. The power electronic assembly of example 12 or 13, wherein the cooling device has a larger footprint than the molded semiconductor module, and wherein the isolation material covers a surface of the cooling device facing the molded semiconductor module in a region of the surface extending from the stepped region of the molded semiconductor module to a side face of the cooling device.

Example 15. The power electronic assembly of any of examples 12 through 14, further comprising a thermal interface material between the cooling device and the bottom side of the molding compound of the molded semiconductor module.

Example 16. The power electronic assembly of any of examples 11 through 15, wherein a linear dimension of the first generally vertical part of the stepped region as measured from the high voltage lead to the generally horizontal part of the stepped region is less than 1 mm.

Example 17. The power electronic assembly of any of examples 11 through 16, wherein a linear dimension of the second generally vertical part of the stepped region as measured from the generally horizontal part of the stepped region to the bottom side of the molding compound is less than 1 mm.

Example 18. The power electronic assembly of any of examples 11 through 17, wherein a linear dimension of the first generally vertical part of the stepped region as measured from the high voltage lead to the generally horizontal part of the stepped region is less than 1 mm, and wherein a linear dimension of the second generally vertical part of the stepped region as measured from the generally horizontal part of the stepped region to the bottom side of the molding compound is less than 1 mm.

Example 19. The power electronic assembly of any of examples 11 through 18, wherein a linear dimension of the molding compound as measured from the second generally vertical part of the stepped region to the thicker part of the leadframe is less than 1 mm.

Example 20. The power electronic assembly of any of examples 11 through 19, wherein a ratio of the linear dimension of the generally horizontal part to a linear dimension of the molding compound as measured from the second generally vertical part of the stepped region to the thicker part of the leadframe is at least 4:1.

Example 21. The power electronic assembly of any of examples 11 through 20, wherein the molded semiconductor module has an impulse withstand voltage of at least 4 kV between the high voltage lead and the cooling device.

Example 22. The molded semiconductor module of any of examples 11 through 21, wherein a thickness of the molded semiconductor package as measured from a bottom of the high voltage lead to the bottom side of the molding compound is less than 1.5 mm.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded semiconductor module, comprising:
    a dual-gauge leadframe having a thicker part and a thinner part, part of the thinner part forming a high voltage lead of the molded semiconductor module;
    a semiconductor die attached to the thicker part of the dual-gauge leadframe; and
    a molding compound encapsulating the semiconductor die and having a top side, a bottom side, and a side face extending between the top side and the bottom side,
    wherein the thicker part of the leadframe is disposed at the bottom side of the molding compound,
    wherein the side face of the molding compound has a stepped region between the high voltage lead and the thicker part of the leadframe,
    wherein the stepped region has a first generally vertical part, a second generally vertical part, and a generally horizontal part,
    wherein the first generally vertical part extends from the high voltage lead to the generally horizontal part, the generally horizontal part extends from the first generally vertical part to the second generally vertical part, and the second generally vertical part extends from the generally horizontal part to the bottom side of the molding compound,
    wherein a linear dimension of the generally horizontal part as measured from the first generally vertical part to the second generally vertical part is at least 4.5 mm.

2. The molded semiconductor module of claim 1, wherein a linear dimension of the first generally vertical part of the stepped region as measured from the high voltage lead to the generally horizontal part of the stepped region is less than 1 mm.

3. The molded semiconductor module of claim 1, wherein a linear dimension of the second generally vertical part of the stepped region as measured from the generally horizontal part of the stepped region to the bottom side of the molding compound is less than 1 mm.

4. The molded semiconductor module of claim 1, wherein a linear dimension of the first generally vertical part of the stepped region as measured from the high voltage lead to the generally horizontal part of the stepped region is less than 1 mm, and wherein a linear dimension of the second generally vertical part of the stepped region as measured from the generally horizontal part of the stepped region to the bottom side of the molding compound is less than 1 mm.

5. The molded semiconductor module of claim 4, wherein the linear dimension of the first generally vertical part of the stepped region is 0.7 mm, and wherein the linear dimension of the second generally vertical part of the stepped region is 0.7 mm.

6. The molded semiconductor module of claim 1, wherein a linear dimension of the molding compound as measured from the second generally vertical part of the stepped region to the thicker part of the leadframe is less than 2 mm.

7. The molded semiconductor module of claim 1, wherein a ratio of the linear dimension of the generally horizontal part to a linear dimension of the molding compound as measured from the second generally vertical part of the stepped region to the thicker part of the leadframe is at least 4:1.

8. The molded semiconductor module of claim 7, wherein the ratio is at least 8:1.

9. The molded semiconductor module of claim 1, wherein a thickness of the molded semiconductor module as measured from a bottom of the high voltage lead to the bottom side of the molding compound is less than 1.5 mm.

10. A method of producing a molded semiconductor module, the method comprising:
    attaching a semiconductor die attached to a thicker part of a dual-gauge leadframe, the dual-gauge leadframe further having a thinner part, part of the thinner part forming a high voltage lead of the molded semiconductor module;
    encapsulating the semiconductor die in a molding compound having a top side, a bottom side, and a side face extending between the top side and the bottom side, the thicker part of the leadframe being disposed at the bottom side of the molding compound; and
    forming a stepped region in the side face of the molding compound between the high voltage lead and the thicker part of the leadframe,
    wherein the stepped region has a first generally vertical part, a second generally vertical part, and a generally horizontal part,
    wherein the first generally vertical part extends from the high voltage lead to the generally horizontal part, the generally horizontal part extends from the first generally vertical part to the second generally vertical part, and the second generally vertical part extends from the generally horizontal part to the bottom side of the molding compound,
    wherein a linear dimension of the generally horizontal part as measured from the first generally vertical part to the second generally vertical part is at least 4.5 mm.

11. A power electronic assembly, comprising:
a molded semiconductor module attached to a cooling device,
wherein the molded semiconductor module comprises:
- a dual-gauge leadframe having a thicker part and a thinner part, part of the thinner part forming a high voltage lead of the molded semiconductor module;
- a semiconductor die attached to the thicker part of the dual-gauge leadframe; and
- a molding compound encapsulating the semiconductor die and having a top side, a bottom side, and a side face extending between the top side and the bottom side, wherein the thicker part of the leadframe is thermally coupled to the cooling device at the bottom side of the molding compound,
wherein the side face of the molding compound has a stepped region between the high voltage lead and the thicker part of the leadframe,
wherein the stepped region has a first generally vertical part, a second generally vertical part, and a generally horizontal part,
wherein the first generally vertical part extends from the high voltage lead to the generally horizontal part, the generally horizontal part extends from the first generally vertical part to the second generally vertical part, and the second generally vertical part extends from the generally horizontal part to the bottom side of the molding compound,
wherein a linear dimension of the generally horizontal part as measured from the first generally vertical part to the second generally vertical part is at least 4.5 mm.

12. The power electronic assembly of claim 11, further comprising an isolation material disposed in a gap between the stepped region of the molded semiconductor module and the cooling device.

13. The power electronic assembly of claim 12, wherein the isolation material extends onto a side face of the cooling device.

14. The power electronic assembly of claim 12, wherein the cooling device has a larger footprint than the molded semiconductor module, and wherein the isolation material covers a surface of the cooling device facing the molded semiconductor module in a region of the surface extending from the stepped region of the molded semiconductor module to a side face of the cooling device.

15. The power electronic assembly of claim 12, further comprising a thermal interface material between the cooling device and the bottom side of the molding compound of the molded semiconductor module.

16. The power electronic assembly of claim 11, wherein a linear dimension of the first generally vertical part of the stepped region as measured from the high voltage lead to the generally horizontal part of the stepped region is less than 1 mm.

17. The power electronic assembly of claim 11, wherein a linear dimension of the second generally vertical part of the stepped region as measured from the generally horizontal part of the stepped region to the bottom side of the molding compound is less than 1 mm.

18. The power electronic assembly of claim 11, wherein a linear dimension of the first generally vertical part of the stepped region as measured from the high voltage lead to the generally horizontal part of the stepped region is less than 1 mm, and wherein a linear dimension of the second generally vertical part of the stepped region as measured from the generally horizontal part of the stepped region to the bottom side of the molding compound is less than 1 mm.

19. The power electronic assembly of claim 11, wherein a linear dimension of the molding compound as measured from the second generally vertical part of the stepped region to the thicker part of the leadframe is less than 1 mm.

20. The power electronic assembly of claim 11, wherein a ratio of the linear dimension of the generally horizontal part to a linear dimension of the molding compound as measured from the second generally vertical part of the stepped region to the thicker part of the leadframe is at least 4:1.

21. The power electronic assembly of claim 11, wherein the molded semiconductor module has an impulse withstand voltage of at least 4 kV between the high voltage lead and the cooling device.

22. The molded semiconductor module of claim 11, wherein a thickness of the molded semiconductor module as measured from a bottom of the high voltage lead to the bottom side of the molding compound is less than 1.5 mm.

* * * * *